United States Patent [19]

Kondoh et al.

[11] Patent Number: 5,448,114

[45] Date of Patent: Sep. 5, 1995

[54] SEMICONDUCTOR FLIPCHIP PACKAGING HAVING A PERIMETER WALL

[75] Inventors: You Kondoh; Masayuki Saito; Takasi Togasaki, all of Yokohama, Japan

[73] Assignee: Kabushiki Kaisha Toshiba, Kawasaki, Japan

[21] Appl. No.: 389,743

[22] Filed: Feb. 15, 1995

Related U.S. Application Data

[63] Continuation of Ser. No. 91,187, Jul. 14, 1993, abandoned.

[30] Foreign Application Priority Data

Jul. 15, 1992 [JP] Japan .................. 4-188308

[51] Int. Cl.⁶ .................. H01L 23/48; H01L 29/44; H01L 29/52; H01L 29/60
[52] U.S. Cl. .................. 257/778; 257/737; 257/738; 257/779; 257/780; 257/781
[58] Field of Search ............... 257/666, 734, 737, 738, 257/739, 777, 778, 779, 780, 781, 704, 710, 787

[56] References Cited

U.S. PATENT DOCUMENTS

| | | | |
|---|---|---|---|
| 3,591,839 | 7/1971 | Evans | 257/737 |
| 3,871,015 | 3/1975 | Lin et al. | 257/737 |
| 4,604,644 | 8/1986 | Beckham et al. | 257/738 |
| 4,710,798 | 12/1987 | Marcantonio | 257/778 |
| 4,942,140 | 1/1990 | Ootsuki et al. | 257/739 |
| 5,021,888 | 6/1991 | Kondou et al. | |
| 5,071,787 | 12/1991 | Mori et al. | |

FOREIGN PATENT DOCUMENTS

| | | |
|---|---|---|
| 56-83054A2 | 12/1979 | Japan . |
| 2-267942A2 | 4/1989 | Japan . |
| 3-214629A2 | 1/1990 | Japan . |
| 3-222334A2 | 1/1990 | Japan . |
| 4-51057 | 8/1992 | Japan . |

OTHER PUBLICATIONS

Proceedings of the 7th International Microelectronics Conference, 1992, Yokohama, Jun. 3–Jun. 5, 1992, pp. 252–258, Y. Tsukada, et al., "Surface Laminar Circuit and Flip Chip Attach Packaging".

*Primary Examiner*—Sara W. Crane
*Assistant Examiner*—Carl Whitehead, Jr.
*Attorney, Agent, or Firm*—Oblon, Spivak, McClelland, Maier & Neustadt

[57] ABSTRACT

A semiconductor device contains a semiconductor chip and a circuit board. The chip has a first surface at which the main region is formed. On the surface, a plurality of chip electrodes and a perimeter electrode surrounding the chip electrodes are formed. Bumps and a wall member made of solder metal are formed on the chip electrodes and frame-shaped electrode, respectively. The circuit board has a first surface facing the first surface of the chip. On the first surface of the circuit board, a plurality of board electrodes and a perimeter electrode are placed so as to correspond to the chip electrodes and the perimeter electrode. In a state where the chip and the board face each other, heat treatment is performed to connect the bumps and wall member to the board simultaneously by reflow. The wall member connects the chip to the board while surrounding the main region and the bumps continuously, to form essentially a closed space between the chip and the board.

6 Claims, 7 Drawing Sheets

SEMICONDUCTOR FLIPCHIP PACKAGING HAVING A PERIMETER WALL

This application is a Continuation of application Ser. No. 08/091,187, filed on Jul. 14, 1993, now abandoned.

BACKGROUND OF THE INVENTION

1. Field of the Invention

This invention relates to a semiconductor device and its manufacturing method, and more particularly to a semiconductor device in which a circuit board and a semiconductor chip are connected to each other by face-down techniques.

2. Description of the Related Art

The recent progress in semiconductor integrated-circuit technology is making electrical equipment smaller, thinner, and more powerful. With such trends, it is more important to assemble semiconductor chips on a circuit board at a high packing density. Some of noticeable assembling methods to meet such requirements are face-down techniques, beam-lead techniques, and tape-carrier techniques. Further, a flip-chip method is expected to be suitable assembling techniques for making the product smaller and thinner.

Figure 14:
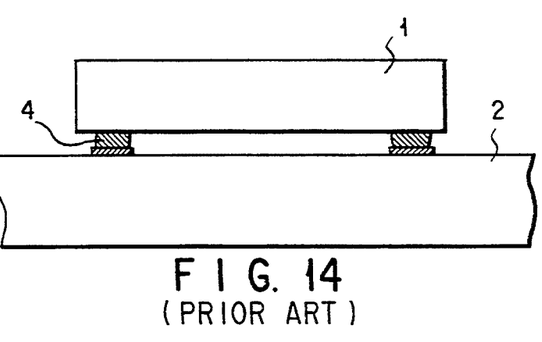
FIG. 14 is a view showing a longitudinal section of a conventional semiconductor device.

FIG. 14 is a sectional view of a conventional semiconductor device assembled by face-down techniques. In the semiconductor device, projected electrodes, called bumps 4, made of metal such as solder or nickel, are formed on pads of a semiconductor chip, the bumps 4 are aligned with the electrode connecting portions of a circuit board 2 and mounted on the latter, and then the semiconductor chip 1 is connected to the circuit board 2 by reflow.

However, since there is generally a difference in coefficient of thermal expansion between the semiconductor chip and the circuit board, a change in temperature permits stress to concentrate on the bumps, which can cause mechanical or electrical breakage, leading to semiconductor device failure. To avoid this, the following methods are now in use at present.

A first method is to use a circuit board whose coefficient of thermal expansion is less different from that of the semiconductor chip. For example, a method has been proposed in which, for a circuit board, a silicon board whose material is the same as that of the chip is used or an aluminum nitride board whose coefficient of thermal expansion is rather less different from that of the chip is used. Under present conditions, however, those circuit boards are generally too expensive for general-purpose products and are therefore limited to special uses.

Under such conditions, use of the most widely used low-cost resin boards, such as glass epoxy, is desired. Since their coefficient of thermal expansion is nearly six times as high as that of silicon, however, breakage due to stress concentrating on the bumps cannot be avoided.

Another method is to cover the entire semiconductor chip with resin so as to impregnate resin in the gap between the semiconductor chip and the circuit board in order to prevent the stress caused by the difference in coefficient of thermal expansion between the chip and the board from concentrating on the bumps. By this method, face-down assembling can be achieved even with the board of aluminum, whose coefficient of thermal expansion is different from that of silicon. This method is already used with resin boards partially made up of glass epoxy, and is rather an effective method as long as it is not applied to very large chips. For very large chips, this method is not sufficient since the absolute value of the distortion due to the difference in coefficient of thermal expansion is large.

Further, there are some restrictions on the properties of the resin. Two of the most important properties are Young's modulus and coefficient of thermal expansion. Specifically, the resin's Young's modulus is required to be somewhat large in order to prevent stress from concentrating on the bumps, whereas it is desirable that the resin's coefficient of thermal expansion should be as close to that of the bumps as possible. This is because when the resin's coefficient of thermal expansion is larger than that of the bumps beyond a certain level, the expansion of the resin itself makes it impossible to ignore the vertical force exerted on the bump junction surface. In this case, bump breakage in a tear-off mode takes place due to the difference in coefficient of thermal expansion between the bumps and the sealing resin, not due to stress concentrating on the bumps because of the difference in coefficient of thermal expansion between the circuit board and the chip. The coefficient of thermal expansion of the bumps made of metal is generally nearly ten times as large as that of the sealing resin, so that failures stemming from such difference cannot be ignored in practical use.

There are two types of bump breakage due to temperature change. One type results from normal temperature changes. For ordinary face-down assembling, temperature cycle test is conducted in a range of $-55°$ C. to $+150°$ C., for example. Failures occurring in this mode result mainly from the fatigue failure of the bumps due to thermal stress. This can be avoided to some extent by the above-described method of covering the entire semiconductor chip with resin so that resin may be impregnated into a gap between the semiconductor chip and the circuit board.

The other type results from temperature change during reflow. Although there may be some difference in reflow temperature depending on solder material, reflow is generally performed at a temperature of nearly $200°$ C. or higher and then cooling down to room temperature is achieved. At this time, the bumps are stressed due to difference in coefficient of thermal expansion, which leads to initial breakage. Since the resin-sealing process can theoretically be carried out only after reflow connection, it cannot be expected that resin sealing prevents initial breakage from causing failures.

In addition, an attempt has been made to improve the reliability of face-down connection by making bumps themselves larger. Making bumps larger, however, not only makes fine-pitch connection more difficult, but also increases the processing time and the number of processes.

In the future, it is expected that semiconductor chips will have more and more wider areas and finer interconnections. If the area of the semiconductor chip become more wider, difference in coefficient of thermal expansion makes greater the distortion caused in the gap between the semiconductor chip and the circuit board. Because of this, as interconnections becomes more finer, it is more difficult to produce bumps whose volume can withstand stress. For the reasons mentioned above, it is expected that it will increasingly more difficult to suppress failures stemming from the difference in coefficient of thermal expansion between the semiconductor chip and the circuit board, using only resin.

Figure 15:
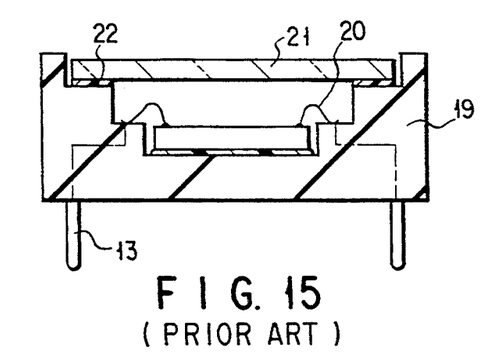
FIG. 15 is a view showing a longitudinal section of another conventional semiconductor device.

In a conventional solid-state camera, such as a CCD, as shown in FIG. 15, an imaging element chip 1 is attached to a ceramics package 19 by die bonding, bonding wires are used for electrical connection, an inert gas is filled inside the package, and sealing is achieved by placing a cover glass 21 on the top face. The cover glass 21 is bonded to the ceramic package 19 with a glass bonding and sealing resin 22 to maintain hermetic sealing. Resin, however, not only permits some moisture to penetrate but also absorbs some, which surely affects such resin sealing. For this reason, the reliability is generally assured by making greater the bonding portion of the cover glass 21 and the ceramic package 19.

These days, however, as a result of the improved yield and lower cost of CCDs, there has been a demand for lower-cost packages. For video cameras and endoscopes, it is most important to make solid-state imaging elements smaller and lighter. To meet these demands, a method has been proposed which uses a glass board previously used as a cover glass, forms a wiring pattern on its surface, and connects the CCD chip through bumps (as disclosed in Published Unexamined Japanese Patent Applications No. 62-318665 and No. 1-90618. With this method, it is possible to make a solid-state camera smaller and lighter remarkably. Further, a method has been proposed which permits a transparent organic layer to be deposited on photosensitive pixels, allows the layer to be left on given pixels by photolithography, heat-treats the remaining transparent organic layer into a semi-convex lens for gathering light (as disclosed in Published Unexamined Japanese Patent Application No. 59-68967).

When a wiring pattern is formed on the glass board as described above, there arises a problem due to resin present on the pixel area such that the lens effect is reduced. With this method, the lens effect comes from the difference in refractive index between the transparent organic layer of the lens and the inert gas or air, but the same effect cannot be expected from the difference in refractive index between the sealing resin and the transparent organic layer because their refractive indexes are close.

It is important, however, for solid-state camera to be made more sensitive as well as smaller and lighter. Therefore, it is necessary to make the former compatible with the latter two. To achieve the effect of the semi-convex lens, a method has been proposed which leaves a gaseous layer in the gap between the glass board and the CCD chip (as disclosed in Published Unexamined Japanese Patent Application No. 3-156776). With this method, it is possible to make a solid-state camera smaller and lighter at low cost without lowering the sensitivity.

Figure 16:
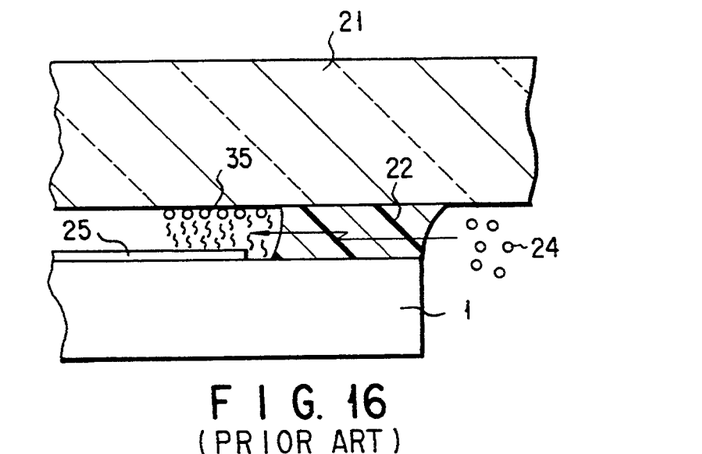
FIG. 16 is a view showing a longitudinal section of still another conventional semiconductor device.

The method of leaving a gaseous layer in the gap between the glass board and the CCD chip, however, has a reliability problem. Specifically, when a solid-state camera is put in a highly humid atmosphere, moisture 24 penetrates the sealing resin 22 into the package, which raises the humidity there. Sudden temperature changes in the atmosphere there and the effects of heat generated by the CCD operation produce a temperature gradient, which permits dew to condense when the temperature of the glass board 21 is lower than that of the internal atmosphere. It is known that dew is liable to condense especially at the peripheral portion of the pixel area 25 and adheres to the surface of the glass board 21.

This takes place because the penetrating path of moisture is short, or the sealing area of the sealing resin is small. Such dew condensation not only has a direct effect on the image, but also may cause electron migration by conduction. Such problems could be solved by increasing the resin sealing area, which would lead to a larger product. Further, dew condensation could also be suppressed by impregnating resin throughout the gap between the glass board and the CCD chip so as not to leave a gaseous layer on the pixel area. This, however, reduces the effect of the semi-convex lens, thus lowering the sensitivity.

Concerning face-down assembly of those CCD chips, there is a heat dissipation problem. The CCD processes signals of relatively high frequencies and generates heat when in operation. As the temperature of the CCD chip rises, dark current increases, resulting in a relative decrease in the sensitivity. As described above, with a solid-state camera using a ceramic package as shown in FIG. 15, the generated heat escapes to the ceramic package, so that the temperature rise of the CCD chip itself can be suppressed to some extent. Since the face-down assembly has few heat-transferring paths, however, the temperature of the CCD chip rises, which causes dark current to increase, resulting in a relative drop in the sensitivity.

Thus, a conventional solid-state camera has the disadvantage that an attempt to realize a small, low-cost resin-sealing package without lowering the sensitivity results in a decrease in the reliability, particularly a decrease in the moisture resistance.

Figure 17:
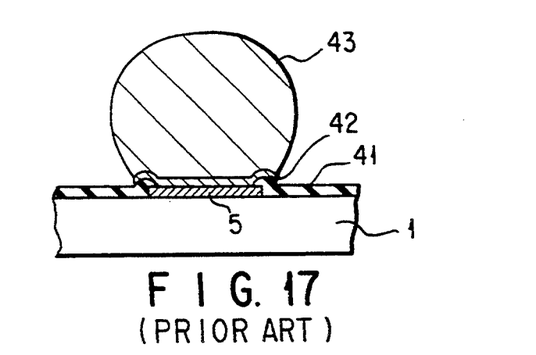
FIG. 17 is a view showing a longitudinal section of a bump on a conventional semiconductor device.

In addition to the package problem, there is a serious reliability problem with bumps themselves, when face-down assembly, such as a flip-chip method, is used. Specifically, conventional bumps used in flip-chip assembly include solder bumps as shown in FIG. 17. A bump 43 is connected via a barrier metal layer 42 to an aluminum electrode pad 5 formed on the surface of a semiconductor chip 1. Formed around the electrode pad 5 is an insulating layer 41, which has an opening in it to expose the electrode pad 5. The barrier metal layer 42 is formed so as to cover the electrode pad 5 via the opening. The barrier metal layer 42 is obtained by forming a chrome or titanium layer by evaporation or sputtering, then further forming on it a copper or nickel layer and a gold layer in sequence by evaporation or sputtering. On this layer, a bump 43 is formed by electroplating or evaporation. For example, solder containing 95% lead and 5% tin is used. Next, if necessary, the portion other than that under the bump 43 of the barrier metal layer 42 is etched away. Finally, the etched portion is heated to melt in an atmosphere of nitrogen in order to shape the bump 43.

Figure 18:
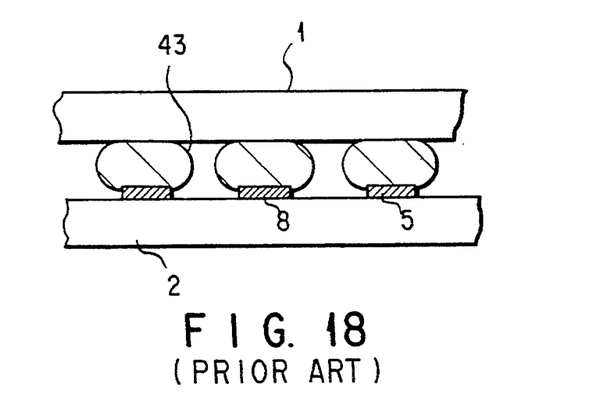
FIG. 18 is a view for explaining the function of the bump.

In this way, an example of flip-chip assembly on a board of a semiconductor device with bumps thus formed is shown in FIG. 18. Bumps 43 on the semiconductor chip 1 are first positioned on the wiring board 2 provided with connection electrodes at the portions corresponding to the bumps so that each bump may mate with a corresponding connection electrode 8, and then the semiconductor chip 1 is placed on the wiring board 2. At this time, if necessary, flux is applied over the wiring board 2. Next, re-fusing the bumps 43 causes the bumps to connect the semiconductor chip 1 to the wiring board 2.

In this case, the pressure applied by the semiconductor chip placed and its own weight during the re-fusing of the bumps reduce the bump's height and widen its width. As a result, the bumps after connection become lower than during the formation of the bumps: the bump's actual height is nearly 50% of its width. Because the bump's width becomes wider during connection, making the distance between solder bumps introduces the danger of causing a short between adjacent bumps. Therefore, in practice, it is necessary to make the distance between bumps larger than the height of the bumps. This requirement makes it difficult to make the distance between bumps shorter for narrower pitches.

Figure 19:
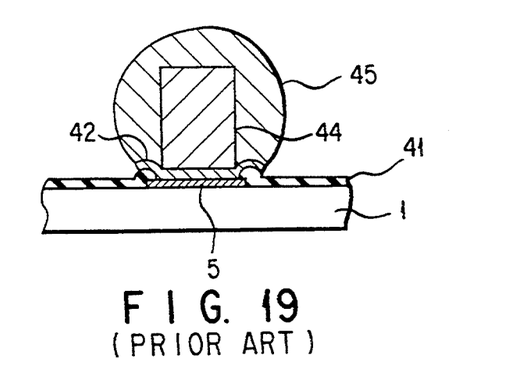
FIG. 19 is a view showing a longitudinal section of a bump on another conventional semiconductor device.

To overcome this problem, as shown in FIG. 19, a bump structure has been proposed in which low melting-point metal such as solder covers the core of high melting-point metal such as copper. In this example, the processes as far as the formation of the barrier metal layer 42 are the same as those shown in FIG. 17. Next, a resist patterning for plating is formed on the barrier metal layer 42 and then a pillar-shaped, high melting-point core layer 44 of copper or nickel is selectively formed by electroplating. Further, a solder layer 45 is formed on the core layer 44 using electroplating. By reflowing the solder layer, a bump is formed. In this case, the bump is constructed so that the solder layer 45 surrounds the core layer 44 in the center.

Figure 20:
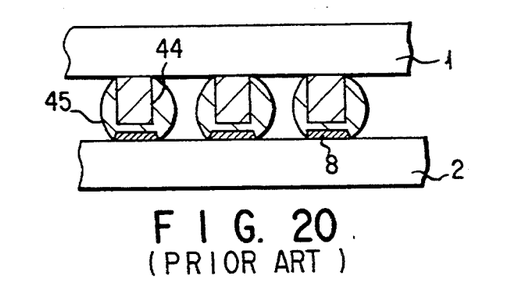
FIG. 20 is a view for explaining the function of the bump.

An example of flip-chip assembly of a thus-formed semiconductor device on a board is shown in FIG. 20. The semiconductor chip 1 with bumps and the wiring board 2 with connection electrode pads 8 are positioned by mating the bumps on the semiconductor chip 1 with the connection electrode pads 8 on the wiring board 2, and then the semiconductor chip 1 is placed on the wiring board 2. Next, the solder layer 45 is re-fused. By cooling the solder layer for hardening, the bumps connects the semiconductor chip 1 to the wiring board 2.

In this case, because the height of the bump is controlled by the core layer 44, the width of the bump after connection cannot become too wide. Therefore, this has the advantage that the distance between bumps can be made a narrower pitch than in the examples shown in FIGS. 17 and 18, because there is no possibility that a short takes place between adjacent bumps.

Figure 21A:
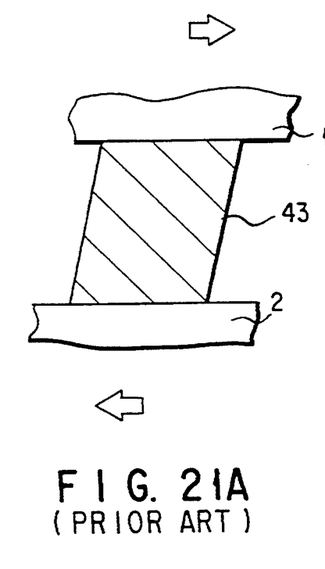
FIGS. 21A and 21B are views for explaining the function of the bump.
Figure 21B:
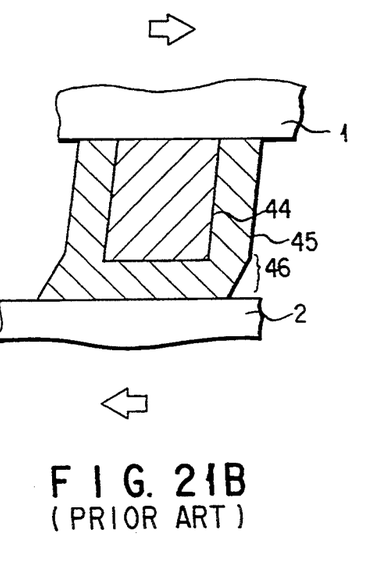

In this example, however, since the core layer 44 is harder than the solder layer 45, when the bump is distorted by external force after connection, distortion will concentrates on the solder layer 45. FIGS. 21A and 21B are schematic views showing the bump distortion. FIG. 21A shows a case where the solder bump of FIG. 17 is distorted, and FIG. 21B shows a case where the bump of FIG. 19 is distorted. In FIG. 21A, the bump is distorted heavily. When the core layer 44 is used, distortion concentrates on the portion 46 between the core layer 44 in the solder layer 45 and the wiring board 2, which makes the portion more liable to fracture, resulting in a decrease in the reliability.

Thus, to increase the connection density by narrowing the distance between adjacent electrodes, it is necessary to suppress the distortion of bumps during connection to prevent adjacent electrodes from short-circuiting with each other due to the decrease of the bump's height during connection. To achieve this, using a hard material for the core of the bump raises the problem that distortion caused by external force under using conditions after connection concentrates on the soft portions of the bump, leading to a decrease in the reliability of the connection portion.

Thus, in semiconductor devices assembled by conventional face-down techniques, there is a problem: stress takes place due to the difference in coefficient of thermal expansion between the semiconductor substrate and the circuit board, causing faulty connections.

Further, particularly with a conventional solid-state camera, an attempt to realize a lower-cost, smaller resin-sealing package without lowering the sensitivity encounters the problem of introducing a decrease in the reliability, especially the moisture resistance.

Still further, for connection by face-down techniques using bumps, a method has been proposed which has a pillar-shaped core layer of high melting point in the center in order to improve the connection density as described earlier. This method, however, has the problem that external force-caused distortion concentrates on the portion of the solder material surrounding the core, lowering the reliability.

SUMMARY OF THE INVENTION

An object of the present invention is to provide a face-down type semiconductor device immune to thermal stress.

Another object of the present invention is to provide a good moistureproof, low-cost solid-state camera package.

Still another object of the present invention is to provide a semiconductor device with highly reliable bumps capable of improving the connection density.

According to a first aspect of the invention, there is provided a semiconductor device comprising: a semiconductor chip having a first surface at which a main region is formed; a plurality of chip electrodes formed on the first surface of the chip; a circuit board provided so as to face the chip, the board having a first surface that faces the first surface of the chip; a plurality of board electrodes provided on the board so as to correspond to the chip electrodes; a plurality of bumps for connecting the chip electrodes to the board electrodes on a one-to-one basis, the bumps being made of solder metal; and a wall member connected to the first surface of the chip and the first surface of the board and contributing to the connection between the chip and the board, the wall member being made of solder metal and provided so as not to touch the bumps.

According to a second aspect of the invention, there is provided a semiconductor device comprising: a semiconductor chip having a first surface at which a main region is formed; a plurality of chip electrodes formed on the first surface of the chip; a circuit board provided so as to face the chip, the board having a first surface that faces the first surface of the chip; a plurality of board electrodes provided on the board so as to correspond to the chip electrodes; a plurality of bumps for connecting the chip electrodes to the board electrodes on a one-to-one basis, the bumps being made of solder metal; and a wall member connected to the first surface of the chip and the first surface of the board and contributing to the connection between the chip and the board, the wall member continuously surrounding the main region so as to form essentially a closed space between the chip and the board.

According to a third aspect of the invention, there is provided a manufacturing method of semiconductor devices, comprising the steps of: forming a plurality of chip electrodes on a first surface of a semiconductor chip at which a main region is formed; forming a plurality of bumps connected to the chip electrodes and a wall member placed so as not to touch the bumps on the first surface of the chip, the bumps and the wall member being made of solder metal; forming a plurality of board electrodes on a first surface of a circuit board so as to correspond to the chip electrodes; causing the chip and the board to face each other so that the first surface of the chip faces the first surface of the board and each of the bumps touches the corresponding one of the board electrodes; and heat-treating the chip and the board while keeping them facing each other and reflow-connecting the bumps and the wall member to the board simultaneously.

With the above arrangement, the wall member suppresses the thermal expansion of the circuit board and absorbs thermal stress instead of the bumps. Since the bumps and wall member are constructed so as to have the same or similar coefficient of thermal expansion, the force perpendicular to the junction surface is less liable to take place. Further, because the wall member can be connected to the bumps in the same process, the breakage of the bumps, including the initial breakage and fatigue failure, due to temperature change can be prevented from happening.

Further, since a semiconductor device of the invention has a solder wall member outside around the main region of the semiconductor chip, it has a sufficient sealing effect of isolating the main region from outside air. In addition, because the wall member has a larger contact area than that of the bumps, it provides much more heat dissipating paths than connection only through the bumps. Therefore, the wall member can be applied to high heat-generating semiconductor devices such as power elements.

Additional effects include an improvement in cell alignment during assembly using surface tension of the solder frame and an electrical shielding effect in the case of the semiconductor chip being a high-frequency element.

Particularly, when the semiconductor chip is a CCD chip, the formation of the frame member out of a material of good thermal conductivity permits the heat generated by the chip to escape to the glass board, which can suppress the rising of the chip's temperature. Heating the surface of the glass board by the heat from the chip prevents dew condensation from occurring. Further, the wall member stops the flow of the sealing resin into the pixel area, making it easy to leave a gap between the glass board and the chip.

Further, the bumps are provided with a first and a second supporting layer made of a first and a second solder metal, respectively, and stacked one on top of another. The second supporting layer can be made thinner, lower in melting point, and greater in yield stress at room temperature than the first supporting layer. In this case, by connecting the chip to the board at a temperature near the softening temperature of the second supporting layer, the first supporting layer can be prevented from being fused and deformed. Therefore, there is little possibility that a short between adjacent bumps will take place, which makes it possible to make the distance between electrode a narrower pitch. The bumps can remain almost the same height before and after connection. Since the yield stress of the first supporting layer is lower than that of the second supporting layer at near room temperature, when the bumps are deformed by external force after connection, the first supporting layer is deformed throughout, with the result that distortion disperses throughout the first supporting layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Referring to the accompanying drawings, embodiments of the present invention will be explained in detail.

Figure 1:
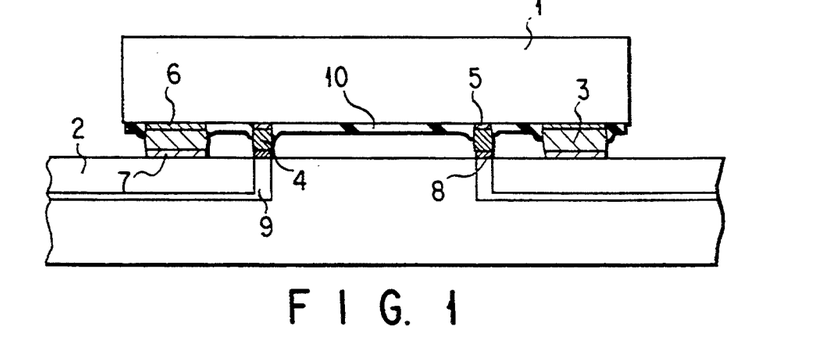
FIG. 1 is a view showing a longitudinal section of a semiconductor device according to a first embodiment of the present invention.
Figure 2:
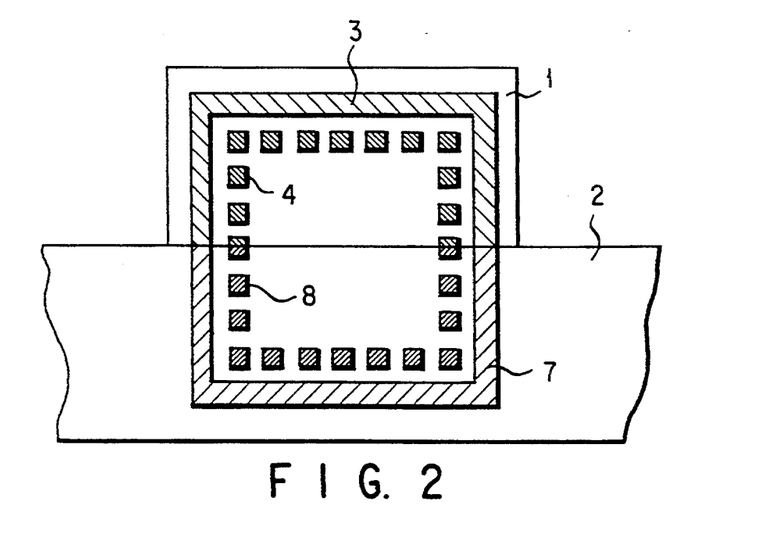
FIG. 2 is a view showing a lateral section the semiconductor device.

A semiconductor device according to a first embodiment of the present invention shown in FIGS. 1 and 2 is characterized that a semiconductor chip 1 is bonded to a circuit board 2 by a wall member 3 made of solder and bumps 4 formed inside the wall member. Specifically, on the semiconductor chip 1, signal electrode taking-out terminal pads 5 and a frame-shaped pad 6 formed of the same material and in the same process as that of the terminal pads are provided. The solder wall member 3 is bonded between the frame-shaped pad 6 and a frame-shaped electrode 7 on the circuit board 2. Similarly, terminal electrodes 8 on the circuit board 2 are bonded to the bumps 4. In this example, the terminal electrodes 8 are connected to internal wires 9 via holes.

These frame-shaped electrode 7 and terminal electrodes 8 are obtained by laminating titanium, nickel, and gold in that order on an aluminum layer. In this embodiment, the frame-shaped electrode 7 is used as a dummy. It is, however, not necessarily a dummy but may be used as one of signal lines. Especially when the semiconductor device is a high-frequency element, using the electrode 7 as a ground line provides a shielding effect.

In FIG. 2, the upper half is a view obtained when the semiconductor chip 1 is seen from the junction surface of the wall member 3 and bump 4 and the electrodes 7 and 8, and the lower half is a view obtained when the circuit board 2 is seen from the junction surface. The solder wall member 3 is formed along a dicing line. Inside the wall member, a bumps 4 are formed of solder of the same composition. On the circuit board 2 whose main material is glass epoxy, the frame-shaped electrode 7 and terminal electrodes 8 are formed at the positions corresponding to the wall member 3 and bumps 4, respectively. The size of the bump 4 is approximately 100 $\mu m$ square and 50 $\mu m$ high, and the wall member 3 is approximately 300 $\mu m$ wide and 50 $\mu m$ high.

By forming the wall member 3 so as to surround the active area of the semiconductor chip 1, the active area can be isolated from outside air. Further, by carrying out the process of reflowing and bonding the bumps 4 and wall member 3 to the circuit board 2 in an inert-gas atmosphere such as nitrogen, the sealing effect can be enhanced. Since the active area is isolated from the outside world by the chip itself, circuit board, and wall member, especially when the semiconductor device is a high-frequency element, the electrical shielding effect can be expected.

In wire-bonding assembly by conventional face-up techniques, the back of the chip is in direct contact with the board, so that heat can dissipate from the back. In contrast, since in face-down assembly, heat dissipation paths are limited to bumps, conventional face-down connection has a heat dissipation problem. As bumps are becoming more finer, their contact area is small and there is a limit to heat dissipation only through bumps. To overcome this problem, a method has been proposed which provides a heat sink on the back of the chip or provides heat-dissipating bumps. Each method has the disadvantage that the number of parts increases, the processes become complicated, and heat dissipation is not sufficient.

Under such circumstances, a semiconductor device of the present invention can provide good heat dissipating effects. For example, in this embodiment, the size of a chip is approximately 6 mm square and the number of pads is approximately 40. Therefore, the contact area of the bump is approximately 0.4 $mm^2$ and that of the wall member is approximately 4.0 $mm^2$, that is, the wall member has nearly ten times as large a contact area as that of the bump. It can be understood from this that the formation of the wall member improves the heat dissipating effect remarkably as compared with assembly only with bumps. Because the wall member is formed at the same surface that contains the active area serving as a heat generating source, it has a heat dissipating effect equal to or higher than that of face-up assembly.

Further, in this embodiment, the wall member has approximately one-tenth the sealing area required for resin sealing. Since the Young's modulus of the sealing resin is approximately one-tenth that of common solder materials, the thermal expansion suppressing effect in this embodiment is almost the same as in resin sealing. By using a material whose Young's modulus is higher than that of a solder material or by making the wall member larger, a more reliable semiconductor device capable of dealing with temperature changes can be obtained.

Further additional effects include self-alignment during reflow and control of the bump shape.

Figure 3:
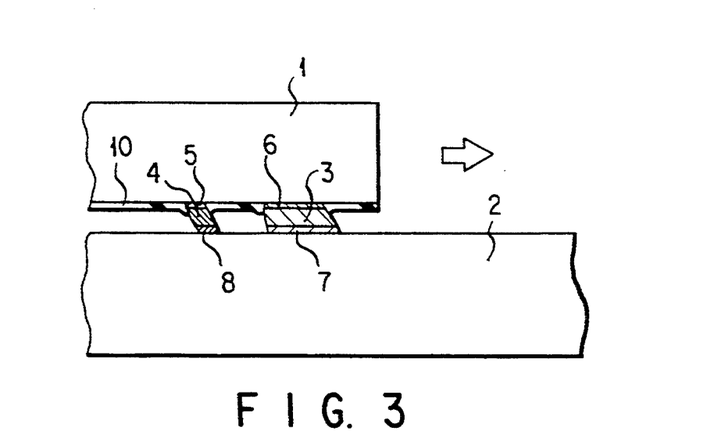
FIG. 3 is a view for explaining the function of the semiconductor device.

First, the effect of self-alignment will be explained. Generally, in connecting by solder, the effect of self-alignment using surface tension can be expected. As shown in FIG. 3, at the time when solder melts and becomes liquid during reflow, the solder bumps 4 will take the most stable shape by their surface tension. For the terminal electrodes 8, a material that provides good wetting to solder is used. As long as the electrodes are not of a special shape, solder tends to connect the terminal pads 5 on the semiconductor chip 1 with the terminal electrodes 8 on the circuit board 2 by the shortest route. The force at that time is proportional to the volume of solder.

In face-down assembly using conventional bumps, connection is made only through bumps and the connection force is so small that it is not always sufficient to obtain the effect of self-alignment. Recently, as bump pitches become finer, there have occurred the failures that bridges are formed or in the initial state, bumps do not touches corresponding electrodes at all. To avoid these failures, it is essential to develop a highly accurate bonding machine, which will require a lot of cost. With this invention, however, by providing the wall member 3 of a larger contact area to generate greater force as shown in FIG. 3, the effect of self-alignment can be enhanced.

Figure 4:
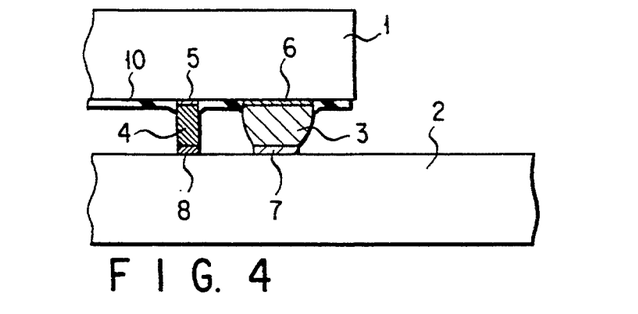
FIG. 4 is a view for explaining the function of the semiconductor device.

Next, the effect of controlling the bump shape will be explained. To absorb distortions resulting from a difference in coefficient of thermal expansion, a tall cylindrical bump or a drum-shaped bump is ideal. As shown in FIG. 4, when a solder bump 4 is reflowed naturally, it is shaped like a symmetrical drum whose side portions bulge. The shape is determined by the volume of solder, the weight of the chip, and the shape and size of the wetted electrode portion. Thus, to make this shape into an ideal one, it is necessary to add improvements to the device and assembly processes or to provide a spacer. With the present invention, however, by increasing the volume of solder of the wall member 3 or controlling the size of the frame-shaped electrode 7, the shape of the bump 4 can be ideally controlled using the force generated by the solder forming the wall member 3.

In this embodiment, a detailed explanation of the assembly processes will be omitted. The connection of the bumps is made simultaneously with that of the wall member. Therefore, even when cooling is achieved from the reflow temperature to room temperature, distortion resulting from the difference in coefficient of thermal expansion between the bump and the wall member is suppressed, which reduces a possibility that initial breakage will take place. Further, because the bump and the wall member are made of the same solder material, there is theoretically no possibility that thermal expansion due to temperature change causes vertical distortion.

Next, a second embodiment of the present invention will be explained.

Figure 5:
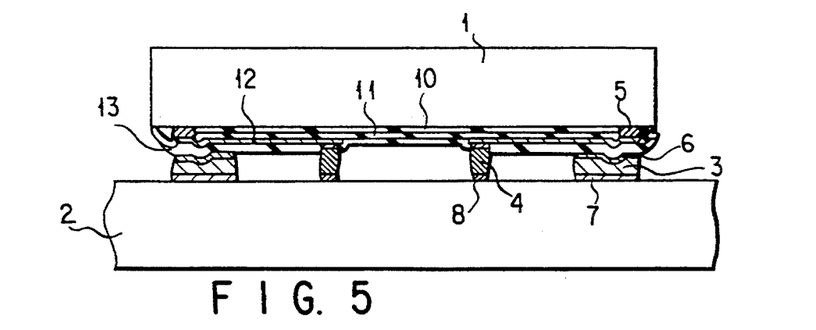
FIG. 5 is a view showing a longitudinal section of a semiconductor device according to a second embodiment of the present invention.

While in the first embodiment, a semiconductor chip dedicated for a semiconductor device of the present invention is used, a second embodiment uses a general-purpose semiconductor chip as shown FIG. 5.

A basic construction is such that in a general-purpose semiconductor chip 1 with terminal pads 5 provided along the peripheral portion of the chip, rearranging wires 12 are provided on a first insulating layer 11 to move the terminal pads to the chip center, and a wall member 3 is placed on a second insulating layer 13 formed on the first insulating layer.

FIGS. 6A through 6E roughly show the manufacturing processes of the semiconductor device.

Generally, in a general-purpose semiconductor chip, because the terminal pads are located in the peripheral portion of the chip 1, there is no room to place a wall member between the pad and a dicing line. Even if a wall member is formed under such conditions, this will simply help narrow the width, making it impossible to provide the sufficient effects of sealing and suppression of thermal expansion. Thus, after the terminal pads are moved toward the center, a wall member is formed in the peripheral portion.

Figure 6A:
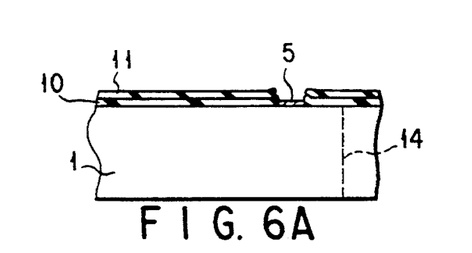
FIGS. 6A through 6E are views showing the sequence of the manufacturing processes of the semiconductor device of the second embodiment.
Figure 6B:
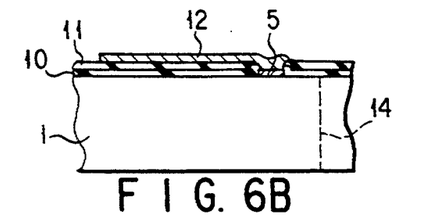
Figure 6C:
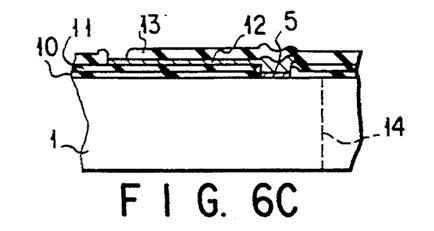

First, as shown in FIG. 6A, a first insulating layer 11 made of polyimide approximately 5 μm in thickness is formed on a terminal pad 5 and a passivation layer 10 formed on the semiconductor chip 1. Then, by photolithography, an opening portion is made in the first insulating layer 11 so as to correspond to the terminal pad 5. Next, as shown in FIGS. 6B and 6C, a rearranging wire 12 is placed from the opening portion to the center portion, the wire being obtained by laminating titanium and copper in that order. Then formed is a second insulating layer 13 made of polyimide approximately 10 μm in thickness. Further, an opening is made in the second insulating layer 13 by photolithography so as to correspond to the terminal pad rearranged near the center.

Figure 6D:
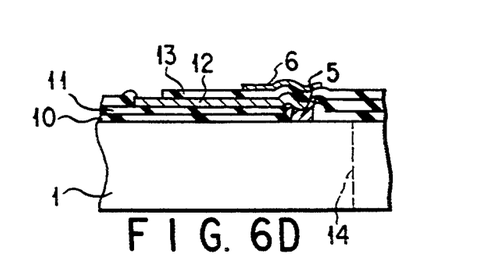
Figure 6E:
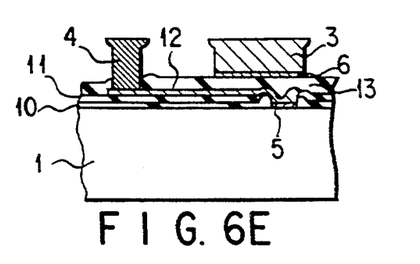

Then, as shown in FIG. 6D, a frame-shaped pad 6 of titanium-copper laminated structure is formed near a dicing line 14 above the terminal pad 5. The frame-shaped pad 6 is not necessarily placed above the terminal pad 5. Finally, as shown in FIG. 6E, a wall member 3 and a bump 4 both made of solder are formed by electroplating. Here, the thickness of solder plating is assumed to be approximately 50 μm.

In an example of forming the wall member 3 and the bump 4 in this way, after resist removal, they are aligned with the circuit board and then reflow connection is made.

Through such processes, a semiconductor device of the present invention can be realized using general-purpose chips, not special semiconductor chips.

In the assembly process of bonding the chip to the board, there are two methods: one is to bond them by one reflow connection and the other is to first reflow only the chip and shape bumps, and then reflow again for bonding. Although either method can be applied to the invention, there may be a case where an improvement must be added to a face-down bonding apparatus that mounts the chip on the board. Specifically, when reflow is performed before bonding as in the latter method, it is difficult to cause the bump's height to coincide with the height of the wall member. For this reason, such an operation is necessary as applies pressure to the chip once to permit all the bumps and the wall member to come into contact with the board and then remove the pressure. In the former method, however, such an operation is not necessary because the bumps and the wall member agree with each other in height. Yet, doing such an operation helps reduce the reject rate.

Next explained will be a third embodiment of the present invention.

Figure 7:
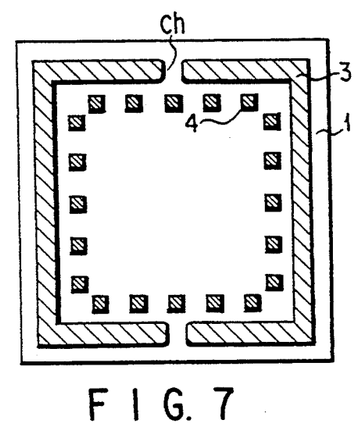
FIG. 7 is a view showing a lateral section of a semiconductor device according to a third embodiment of the present invention.

As shown in a view of FIG. 7 obtained when the semiconductor chip is seen from the junction surface of the bumps and wall member and the circuit board, the semiconductor device differs from the above embodiments in that the wall member has discontinuous gaps Ch in it. In this embodiment, there are two gaps. The gaps Ch are obtained by removing a frame-shaped electrode at the processing stage and remain as openings even after reflow connection. The openings are used to replace the internal atmosphere. Their height is approximately 50 μm and their width is approximately 300 μm.

The reflow connection of the chip and board is achieved using flux in the air or in a reduced atmosphere. The purpose of this is to remove the oxide film on the solder surface for good connection. When flux is used, washing is achieved through the openings. Then, this is placed in an atmosphere of an inert gas such as nitrogen to replace the internal atmosphere, and at the same time, solder blocks of 40×250×350 μm is placed in the openings. The openings are then closed by reflow. In this way, an inert-gas atmosphere can be sealed inside the semiconductor device.

When reflow connection is made in an inert-gas atmosphere, the openings shown in this embodiment are not necessarily required.

Next explained will be a solid-state camera according to a fourth embodiment of the present invention.

Figure 8:
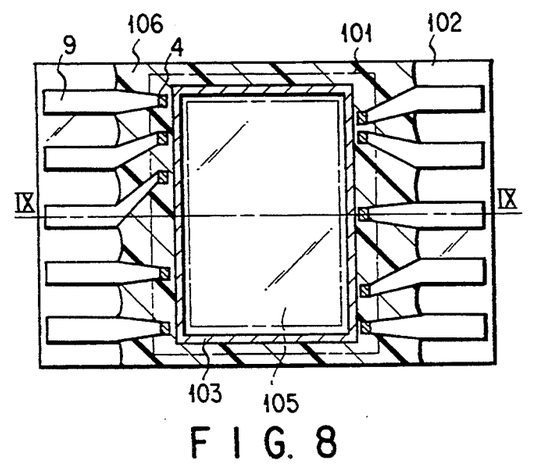
FIG. 8 is a view showing a lateral section of a semiconductor device according to a fourth embodiment of the present invention.
Figure 9:
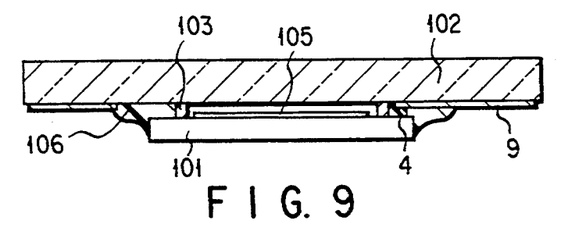
FIG. 9 is a view showing a longitudinal section of the semiconductor device of the fourth embodiment.
Figure 10:
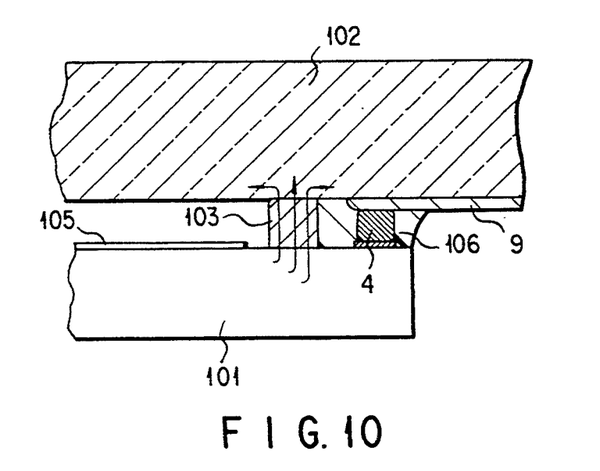
FIG. 10 is a view for explaining the function of the semiconductor device of the fourth embodiment.

FIG. 8 shows a lateral section, FIG. 9 is a sectional view taken along IX—IX line of FIG. 8, and FIG. 10 is an enlarged view of an important portion. A CCD chip 101 is connected via bumps 4 to a glass board 102 on which wires 9 are formed, with the chip's face down. A wall member 103 of 50 μm high and 80 μm wide obtained by forming a gold-plated layer on a copper pattern is bonded to both of the surface of the CCD chip 101 and that of the glass board 102 so as to enclose a pixel area 105. Outside the wall member, a sealing resin 106 is filled.

The wall member 103 is formed by forming bumps 4 on the chip 101 and at the same time, forming a copper pattern and gold-plating it by electroplating.

With this construction, the rise of temperature of the CCD chip can be suppressed, so that a decrease in the relative sensitivity caused by an increase in dark current can be suppressed. Since the temperature at the glass board surface rises due to the heat transferred from the CCD chip and is kept at a temperature higher than the internal atmosphere, dew condensation can be prevented. When a sealing resin of relatively low viscosity is used, the wall member can be used to stop the flow of resin, which makes it easy to leave a gaseous layer on the pixel area 105. As shown by the arrows in FIG. 10 indicating the heat transfer path in the solid-state camera, the heat generated in the pixel area 105 near the center of the CCD chip 101 is transferred to the glass board 102 via the wall member 103. The amount of heat transferred is much larger than that via the bumps. In this way, the heat transferred from the CCD chip to the glass board spreads in every direction to heat the board surface.

Dew condensation is such a phenomenon that when a vapor-containing atmosphere hits a solid whose surface temperature is lower than that of the atmosphere, it is partially cooled down there to such an extent that it exceeds the saturated steam amount, so that steam in the atmosphere becomes water, which then adheres to the solid surface. Therefore, to avoid this phenomenon, the amount of steam in the atmosphere should be reduced or the temperature of the solid should be kept higher than that of the atmosphere. In the case of this embodiment, by raising the temperature of the glass board 102, dew condensation on its surface can be avoided.

In face-down assembly as with this embodiment, temperature at the CCD surface during operation rises up to approximately 80° C. when measured. Efficient transfer of this heat to the glass board would prevent dew condensation provided that the internal atmosphere does not reach the saturated steam state at 80° C. or higher even with any transfer loss. At present, 60° C. 90% R.H. (relative humidity) is used as the reliability evaluation criteria. Under such conditions, dew condensation is not likely to occur. In practical use, a common camera is hardly used in a saturated steam state at 80° C. or higher. Therefore, it can be considered that sufficient reliability is assured in practical use. While in this embodiment, the wall member 103 and the bumps are formed in the same process, the wall member 103 may be previously formed separately and aligned in a specified position in face-down bonding into an integral unit. This method has the advantage that the material of the wall member 103 can be selected freely. The method, however, requires a means of bonding the wall member to either the CCD chip 101 or the glass board 102 into integral structure.

While in this embodiment, the wall member 103 is made up of a continuous frame-shaped member, it may have gaps in it. In this case, it is impossible to expect all the aforementioned effects, but the main effect or the effect of improving the thermal conductivity can be obtained. For example, when more than one pillar is formed by ball bonding or when the process of allowing small metal balls to adhere is used, many gaps are formed. Depending on the viscosity of resin, however, resin may flow from the gaps, and there is a possibility that the ease of the formation of a gaseous layer or the heat transfer efficiency will be impaired.

Further, it is desirable that the wall member should be placed as close around the pixel area as possible. It is because the heat source generating the largest amount of heat in the active area on the CCD chip is the pixel area, and consequently it is near the central portion that the temperature rises most. Therefore, as in this embodiment, placing the wall member around the pixel area provides the highest efficiency of heat conductance. Dew condensation is liable to take place at the edges of the air layer or around the pixel area. In this sense, the wall member should be placed close around the pixel area.

While in this embodiment, the wall member is made of a gold-plated copper, other materials may be used. For example, metals with some heat conductivity, such as silver, gold, iron, and aluminum, and their alloys may be used. The place in which the wall member is formed is not limited to around the pixel area, it may be formed outside the bump connection or near around the chip.

Next explained will be a fifth embodiment of the present invention.

Figure 11:
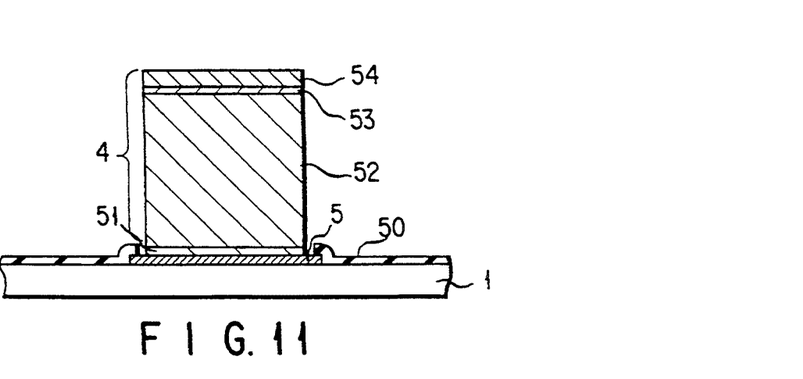
FIG. 11 is a view showing a longitudinal section of a bump on a semiconductor device according to a fifth embodiment of the present invention.

FIG. 11 is a sectional view of a bump structure in connection with a fifth embodiment of the present invention. A bump 4 is formed on an electrode pad 5 of aluminum formed on a semiconductor chip 1. Around the electrode pad 5, an insulating layer 50 made of silicon oxide is formed so as to have an opening corresponding to the pad 5. On the electrode pad 5, a 500-nm-thick first barrier layer 51 of three-layer structure of titanium-nickel-gold is formed. On the first barrier layer, a 30 to 40 $\mu$m-thick first supporting layer 52 of lead, a 500-nm-thick second barrier layer 53 of copper or palladium, and a 5 to 10 $\mu$m-thick supporting layer 54 made of an alloy containing 40% by weight of lead and 60% by weight of tin are stacked in that order. The melting point of the first supporting layer 52 is higher than that of the second supporting layer 54, and is constructed so that the yield stress may be small at room temperature.

A method of forming the bump 4 will be explained.

Figure 12A:
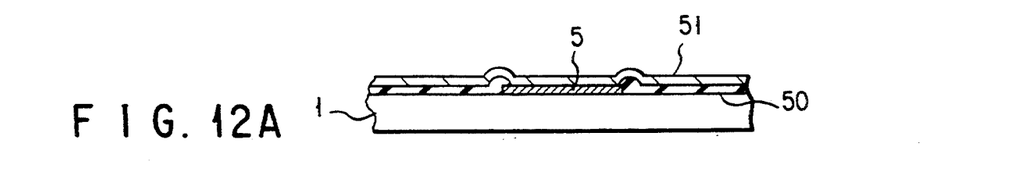
FIGS. 12A through 12E are views showing the sequence of the manufacturing processes of the bump in connection with the fifth embodiment.

As shown in FIG. 12A, on the semiconductor chip 1 on which the electrode pad 5 has been formed, the insulating film 50 is formed using sputtering techniques or chemical vapor growth techniques. Through an etching process, an opening portion is made in the insulating film 50 corresponding to the electrode pad 5. By forming a titanium layer, a nickel layer, and a gold layer in that order on the entire surface by sputtering or vacuum deposition, the first barrier layer 51 is formed.

Figure 12B:
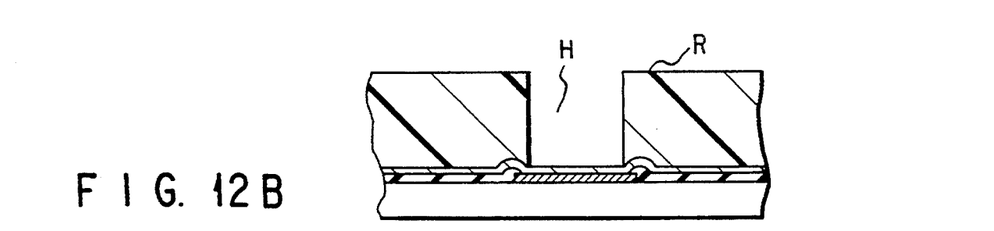

Next, as shown in FIG. 12B, a resist layer R is formed to a thickness of 30 to 50 $\mu$m on the first barrier layer 51. An opening portion H is made only above the electrode pad 5 by photolithography.

Figure 12C:
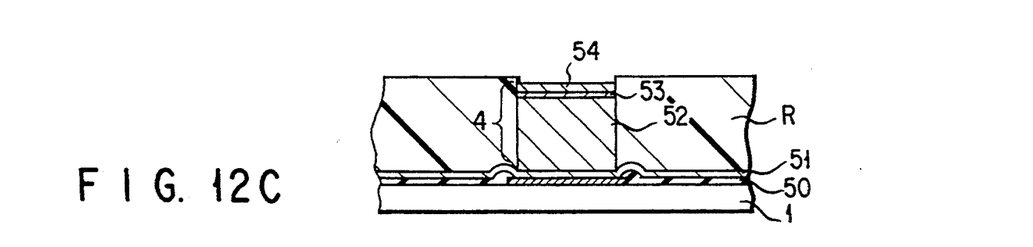

Then, as shown in FIG. 12C, using the first barrier layer 51 as a plating electrode, the lead first supporting layer 52 of pillar shape is formed by electroplating so as to fill the opening portion H. After this, the second barrier layer 53 made of nickel, copper, or palladium, and the second supporting layer 54 containing 40% by weight of lead and 60% by weight of tin are formed in sequence by electroplating to form the bump 4.

Figure 12D:
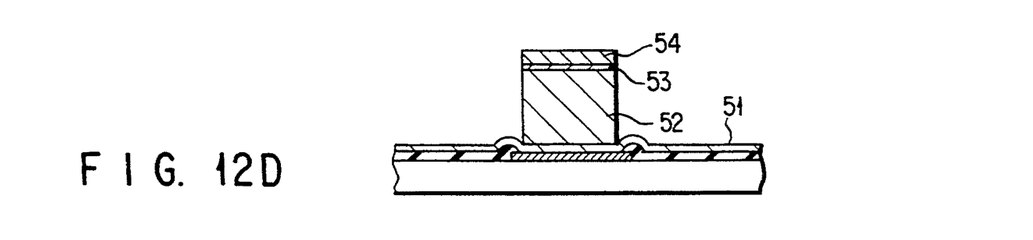

Next, as shown in FIG. 12D, the resist pattern R is removed using an exfoliating solution.

Figure 12E:
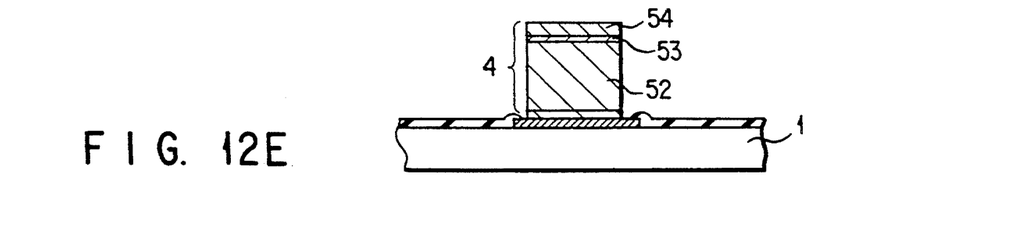

Then, as shown in FIG. 12E, using the bump 4 as a mask, the portion other than that just under the bump 4 of the first barrier layer 51 is etched away.

The formation of the first supporting layer 52, the second barrier layer 53, and the second supporting layer 54 is not limited to electroplating. Electroless plating, vacuum deposition, or sputtering may be used instead. In the case of vacuum deposition or sputtering, the metal layer deposited on the portion other than the opening portion H is removed by liftoff in the resist-exfoliating process.

A combination of the first supporting layer and second supporting layer is not restricted to the above combination. Other acceptable ones include a combination of a lead-tin alloy and a bismuth-tin alloy, a combination of an indium-lead-tin alloy and a bismuth-tin alloy, and a combination of a lead-tin alloy and an antimony-tin alloy.

Figure 13A:
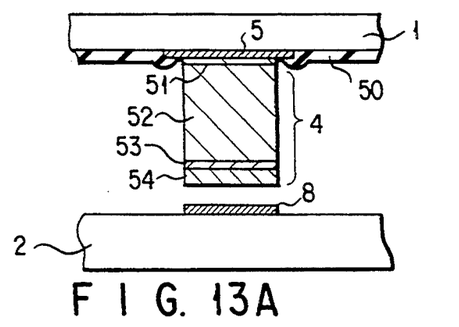
FIGS. 13A through 13C are sectional views showing the sequence of assembly on the wiring board of the semiconductor device.
Figure 13B:
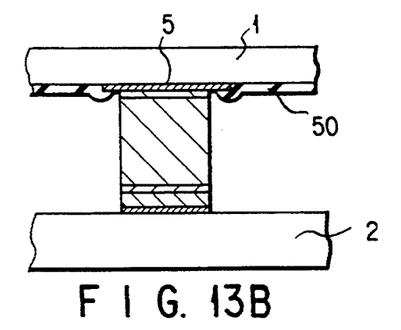
Figure 13C:
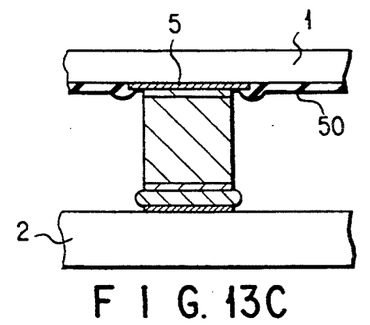

FIGS. 13A to 13C are sectional views showing a method of connecting bumps thus formed to the wiring board.

As shown in FIG. 13A, the semiconductor chip 1 on which a bump 4 is formed is aligned with the wiring board 2 so that the bump 4 may face a connection electrode 8 formed on the wiring board.

Next, as shown in FIG. 13B, by applying pressure to the semiconductor chip 1 and the wiring board 2, temporary bonding is achieved.

Next, as shown in FIG. 13C, the semiconductor chip 1 and the wiring board 2 are heated to 220° C. to fuse the second supporting layer 54. At this time, the first supporting layer 52 is not fused and its shape remains unchanged, because its melting point is 327° C. Then, by lowering the temperature of the semiconductor chip 1 and the wiring board 2, the second supporting layer 54 solidifies, thereby connecting the semiconductor chip 1 to the wiring board 2 electrically and mechanically.

With this configuration, the bump 4 is deformed less during connection. Therefore, since a short between adjacent bumps due to the flow of bump is less likely to take place, the distance between adjacent bumps can be made a narrower pitch. The shape of the bump 4 after connection is such that the electrode can be kept sufficiently high.

Further, because at near room temperature, the yield stress of the first supporting layer 52 is lower than that of the second supporting layer 54, the first supporting layer 52 is more liable to be deformed than the second supporting layer 54 after connection. Therefore, when distortion occurs due to external force after connection, the first supporting layer 52, not the second supporting layer 54, is distorted throughout. Because the first supporting layer 52 occupies the major portion of the volume of the bump 4, distortion is dispersed almost throughout the bump 4. For this reason, distortion per unit volume becomes smaller, providing a highly reliable semiconductor device.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor chip having a first surface at which a pixel area is formed;
   a plurality of chip electrodes formed on said first surface of said chip around said pixel area;
   a transparent board provided so as to face said chip, said board having a first surface which faces said first surface of said chip;
   a plurality of board electrodes provided on said board so as to correspond to said chip electrodes;
   a plurality of bumps for connecting said chip electrodes to said board electrodes on a one-to-one basis, said bumps being made of a solder metal;
   wiring layers formed on said first surface of said board and connected to said chip electrodes through said bumps and board electrodes; and
   a wall member connecting said first surface of said chip to said first surface of said board, and arranged to be surrounded by said bumps and to continuously surround said pixel area so as to form an essentially closed space between said chip and said board, said wall member being made of a material which has a coefficient of thermal expansion the same as or similar to that of said solder metal of said bumps so as to contribute to the connection between said chip and said board and undertake stress caused by a thermal effect applied to said device, and which transfers heat generated in said pixel area to said board so as to increase a temperature of said first surface of said board and prevent dew condensation thereon in said closed space.

2. The device according to claim 1, wherein said board is made of glass.

3. The device according to claim 1, wherein said wall member is made of a solder metal as said material and provided so as not to be in contact with said bumps.

4. The device according to claim 3, wherein said solder metal of said wall member is essentially the same as said solder metal of said bumps.

5. The device according to claim 1, further comprising a first connection layer made of a material essentially the same as that of said chip electrodes and provided between said chip and said wall member, and a second connection layer made of a material essentially the same as that of said board electrodes and provided between said board and said wall member.

6. The device according to claim 1, further comprising a resin sealing layer provided between said chip and said board so as to surround said wall member.

* * * * *